(12) United States Patent
Lee

(10) Patent No.: US 7,148,827 B2
(45) Date of Patent: Dec. 12, 2006

(54) OFFSET COMPENSATING APPARATUS AND METHOD OF DIGITAL/ANALOG CONVERTER

(75) Inventor: Woo-Yol Lee, Seoul (KR)

(73) Assignee: LG Electronics Inc., Seoul (KR)

(*) Notice: Subject to any disclaimer, the term of this patent is extended or adjusted under 35 U.S.C. 154(b) by 703 days.

(21) Appl. No.: 10/379,249

(22) Filed: Mar. 4, 2003

(65) Prior Publication Data
US 2003/0164812 A1    Sep. 4, 2003

(51) Int. Cl.
H03M 1/06    (2006.01)
(52) U.S. Cl. ............................ 341/118; 341/120; 341/121
(58) Field of Classification Search ................ 341/118, 341/120, 121
See application file for complete search history.

(56) References Cited

U.S. PATENT DOCUMENTS 4,843,394 A * 6/1989 Linz et al. .................. 341/154
5,696,508 A * 12/1997 Gross et al. ................ 341/118
6,204,785 B1 * 3/2001 Fattaruso et al. ........... 341/120

* cited by examiner

Primary Examiner—Rexford Barnie
Assistant Examiner—Khai M. Nguyen
(74) Attorney, Agent, or Firm—Lee, Hong, Degerman, Kang, Schmadeka

(57) ABSTRACT

An offset compensating apparatus and method of a digital/analog converter that are capable of preventing an offset of a driving unit by switching an offset generated from an LCD panel driving unit of an LCD projection TV, by adding a current cell of the least significant bit, by adjusting and outputting a Vcom voltage of a buffer stage, or by including an offset compensating unit for changing a digital coding circuit.

27 Claims, 6 Drawing Sheets

OFFSET COMPENSATING APPARATUS AND METHOD OF DIGITAL/ANALOG CONVERTER

BACKGROUND OF THE INVENTION

1. Field of the Invention

The present invention relates to a digital/analog converter and, more particularly, to an offset compensating apparatus of a digital/analog converter for compensating an offset generated from an LCD panel driving unit of a liquid crystal display (LCD) projection TV, and an offset compensating method using the same.

2. Description of the Related Art

Recently, the LCD projection TV employing an enlarged projection method is widely used as a large scale display device. The LCD projection TV uses a principle that as a strong light beam radiated from a lamp passes through an LCD, a TV image displayed on the LCD is projected on a screen. For the purpose of driving an LCD panel, the LCD projection TV includes a driving unit consisting of a digital/analog converter and a buffer unit.

However, in the LCD projection TV, an output value of the driving unit mainly contains an offset due to an influence of a peripheral circuit or a temperature. Since the offset affects considerably a picture quality of the screen, a laser trimming method has been adopted to remove the offset generated from the driving unit.

The laser trimming method is a technique for varying a resistance by trimming a resistance value with laser as mentioned in AD 8380 of Analog Device Co.

FIG. 1 is a circuit diagram of an offset compensating apparatus of a DAC trimming a resistance value by using laser in an LCD projection TV in accordance with a conventional art.

As shown in FIG. 1, in the conventional offset compensating apparatus, '0' or '1' is inputted as a switching signal as a digital input value from the least significant bit (LSB) to the most significant bit (MSB) in response to an analog output voltage (Vout) of a buffer unit 11 including an operational amplifier (OP) Amp, to turn on or off a switch to control the output voltage (Vout) of the OP Amp.

That is, in controlling the output voltage, if an offset occurs due to disagreement of resistances, resistance values of 2R and R are varied to change a value of 'I'' thereby obtaining an accurate value of the output voltage (Vout) of the OP Amp by using the laser trimming method, which can be expressed by the below equation (1):

$$V_{out} = V_{com} \pm I' \times 2R_{11} \quad (1)$$

wherein $V_{com}$ indicates an input voltage of a positive terminal of the OP Amp, $2R_{11}$ indicates a feedback resistance of the OP Amp, and I' indicates a current flowing at the feedback resistance.

However, the resistance varying using the laser trimming is disadvantageous in that a chip unit price increases and a high-priced process expense is incurred to construct it.

SUMMARY OF THE INVENTION

Therefore, an object of the present invention is to provide an offset compensating apparatus and method of a digital/analog converter that are capable of preventing an offset of a driving unit by switching an offset generated from an LCD panel driving unit of an LCD projection TV by adding a current cell of the least significant bit, adjusting and outputting a Vcom voltage of a buffer stage, or including an offset compensating unit for changing a digital coding circuit.

To achieve these and other advantages and in accordance with the purpose of the present invention, as embodied and broadly described herein, to there is provided an offset compensating apparatus of a digital/analog converter which detects an offset contained in an output value received from a driving unit by sampling it through an analog/digital converter (ADC), and outputs an offset compensation value corresponding to the detected offset to the driving unit.

To achieve the above objects, there is also provided an offset compensating method of a digital/analog converter including the steps of: sampling an offset generated from a driving unit; digitalizing the sampled offset value; and calculating the digitalized offset value and compensating an input value of a buffer stage of the driving unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
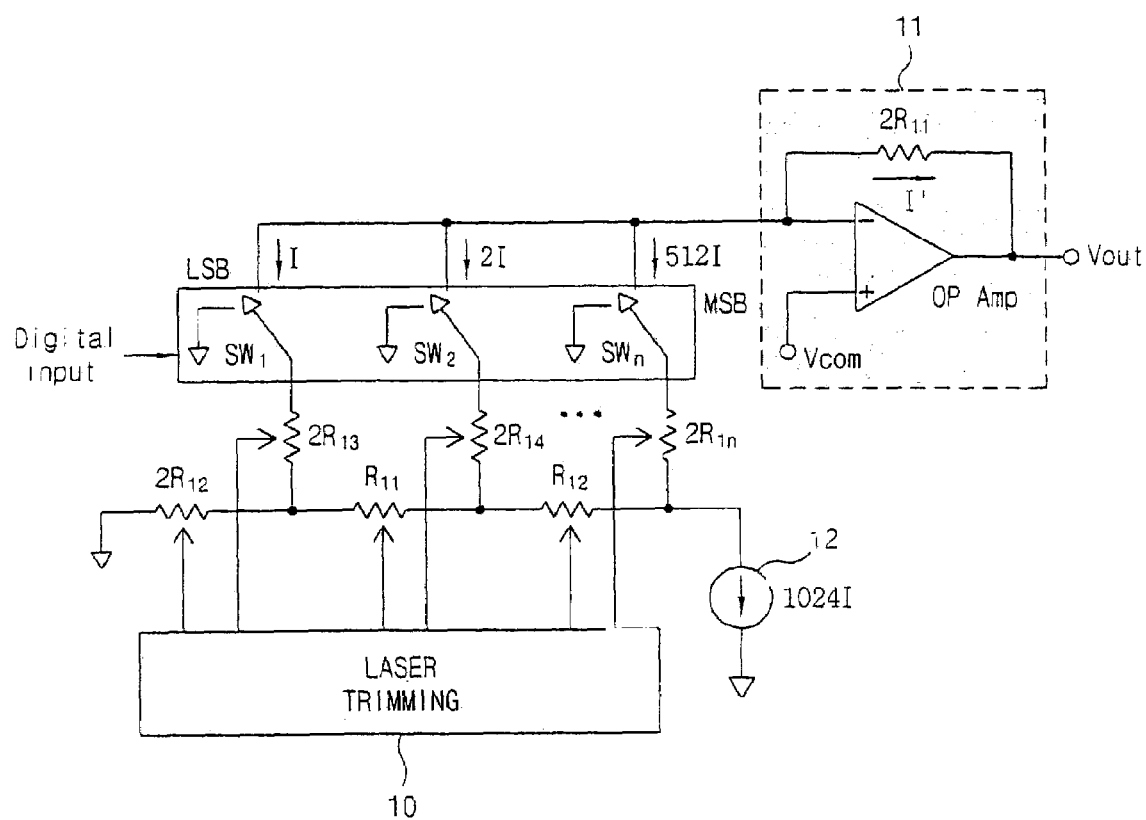
FIG. 1 is a circuit diagram of an offset compensating apparatus of a digital/analog converter which trims a resistance value by using laser in an LCD projection TV in accordance with a conventional art.
Figure 2:
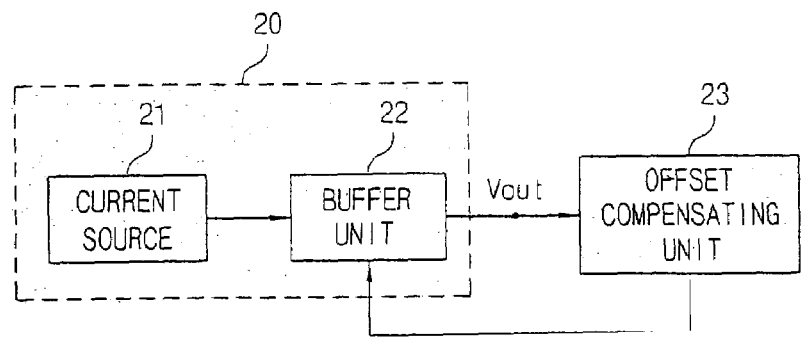
FIG. 2 is a block diagram of a driving unit including an offset compensating apparatus of a digital/analog converter in accordance with the present invention.

FIG. 2 is a block diagram of a driving unit including an offset compensating apparatus of a digital/analog converter in accordance with the present invention.

As shown in FIG. 2, a driving unit 20 having an offset compensating apparatus of a digital/analog converter includes: a current source 21 for supplying a certain current; a buffer unit 22 for comparing an input voltage added or subtracted by the current source 21 and a reference voltage and outputting a corresponding voltage level; and an offset compensating unit 23 for sampling and detecting an offset contained in the output value of the buffer unit 22 through an analog/digital converter; and outputting an offset compensation value corresponding to the detected offset to the buffer unit 22.

The operation of the offset compensating apparatus of the digital/analog converter constructed as described above will now be explained.

The buffer unit 22 compares an input voltage added or subtracted as much as a voltage drop by the current source 21 and a reference voltage, and outputs a corresponding voltage level.

Thereafter, the offset compensating unit 23 samples and detects an offset contained in the output value of the buffer unit 22 through an analog/digital converter, digitalizes and calculates the detected offset value, and outputs the calculated offset compensation value as an input value of the buffer unit 22, thereby compensating an offset compensation.

Meanwhile, in a different embodiment of the present invention, a current cell of the least significant bit can be added to the digital/analog converter circuit of an LCD projection TV, in order to switch a switch of the least significant bit to thereby remove an offset, which will now be described in detail.

Figure 3:
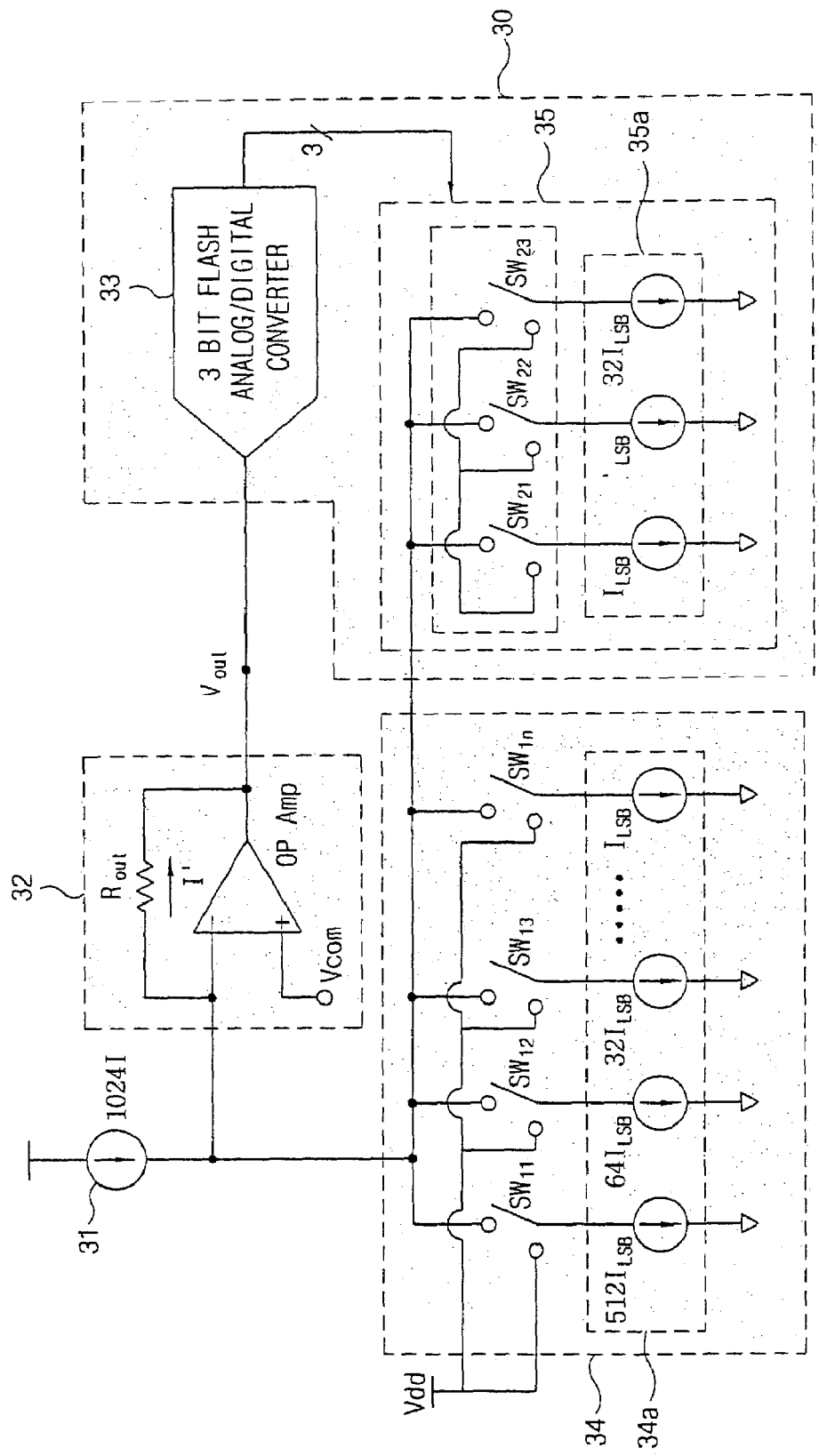
FIG. 3 is a circuit diagram of the offset compensating apparatus of a digital/analog converter which performs an offset compensation by adding a current cell of the least significant bit.

FIG. 3 is a circuit diagram of the offset compensating apparatus of a digital/analog converter which performs an offset compensation by adding a current cell of the least significant bit.

As shown in FIG. 3, the driving unit having the offset compensating unit 30 of a digital/analog converter includes: a PMOS (P-channel metal-oxide semiconductor) current source 31 for supplying a certain current; a buffer unit 32 for comparing an input voltage added or subtracted as much as a voltage drop by the current source 31 and outputting a corresponding voltage level; a first expectation value voltage controller 34 switched corresponding to the output value of the buffer unit 32 and providing a path of the current source 31 to thereby control an expectation value; and an offset compensating unit 30 switched corresponding to the output value of the buffer unit 32 and controlling a current amount with the expectation value.

The offset compensating unit 30 consists of a 3 bit flash analog/digital converter 33 for sampling an offset upon receiving the output vale of the buffer unit 32 and digitalizing the offset value to output it; and a second expectation value voltage controller 35 switched upon receiving the output value of the 3 bit flash analog/digital converter 33 and controlling a current amount with the expectation voltage.

The first expectation value voltage controller 34 includes switches ($SW_{11} \sim SW_{1n}$) switched by a digital signal and a plurality of (1~n) parallely connected NMOS current sources 34a each being connected in series to the switches and having a certain current value.

The second expectation voltage controller 35 includes switches ($SW_{21} \sim SW_{23}$) switched by a digital signal and a plurality of parallely connected NMOS current sources 35a each being connected in series to the switches and having a certain current value.

The operation of the present invention will now be described.

First, an operation principle of the present invention is that 1024ILSB flows from the PMOS current source 31 and a decoded current flows from the first and second NMOS current sources 34a and 35a. Accordingly, an output voltage for the construction can be expressed by below equation (2):

$$V_{out} = V_{com} - R_{out}(1024I_{LSB} - nI_{LSB} \pm nI_{LSB}) \qquad (2)$$

wherein $1024I_{LSB}$ indicates the PMOS current source 31, $nI_{LSB}$ indicates the first NMOS current source 34a and $nI_{LSB}$ indicates the second NMOS current source 35a.

That is, an offset is generated in the output value due to the mismatch possibly generated from the PMO current source 31 and the mismatch possibly generated from the first NMOS current source 34a.

Thus, the offset generated in outputting of the buffer unit 32 is sampled through the 3 bit flash analog/digital converter 33 and digitalized.

Thereafter, upon receiving the digital value, a current amount is controlled by turning on or off the switch of the second expectation value voltage unit 35, thereby removing the generated offset.

For instance, if an expectation value of the output voltage of the buffer unit 32 is 7V, the offset compensating unit 30 controls ON/OFF of the switch switched upon receiving the 3 bit flash analog digital signal corresponding to the offset generated from the output of the buffer unit 32 on the basis of 7V. Thus, the offset compensating unit 30 controls the current amount of the second NMOS current source 35a and outputs a compensated offset value. Thereafter, the output value of the offset compensating unit 30 is processed by the first expectation value voltage controller 34 to obtain 7V, the output voltage (Vout) of the expectation value.

At this time, in order to make the output voltage to be 7V, the expectation value, the offset compensating unit turns on or off the switches ($SW_{21} \sim SW_{23}$) for the case of $2^3$ according to whether the output voltage is higher or lower than 7V, thereby performing an offset compensation.

That is, in equation (2), if an output voltage except for $mI_{LSB}$ of the second expectation value voltage controller 35 is 6.9V, the switches ($SW_{21} \sim SW_{23}$) of the offset compensating unit 30 are turned on to be (111,110,101). Meanwhile, if an output voltage except for $mI_{LSB}$ of the second expectation value voltage controller 35 is 7.1V, the switches ($SW_2 \sim SW_{23}$) of the offset compensating unit 30 are turned off to be (000,001,010), whereby the offset is adjusted to be 7V.

In a still different embodiment of the present invention, the offset compensation can be performed by adjusting the Vcom voltage of the buffer stage, which will now be described with reference to FIG. 4.

Figure 4:
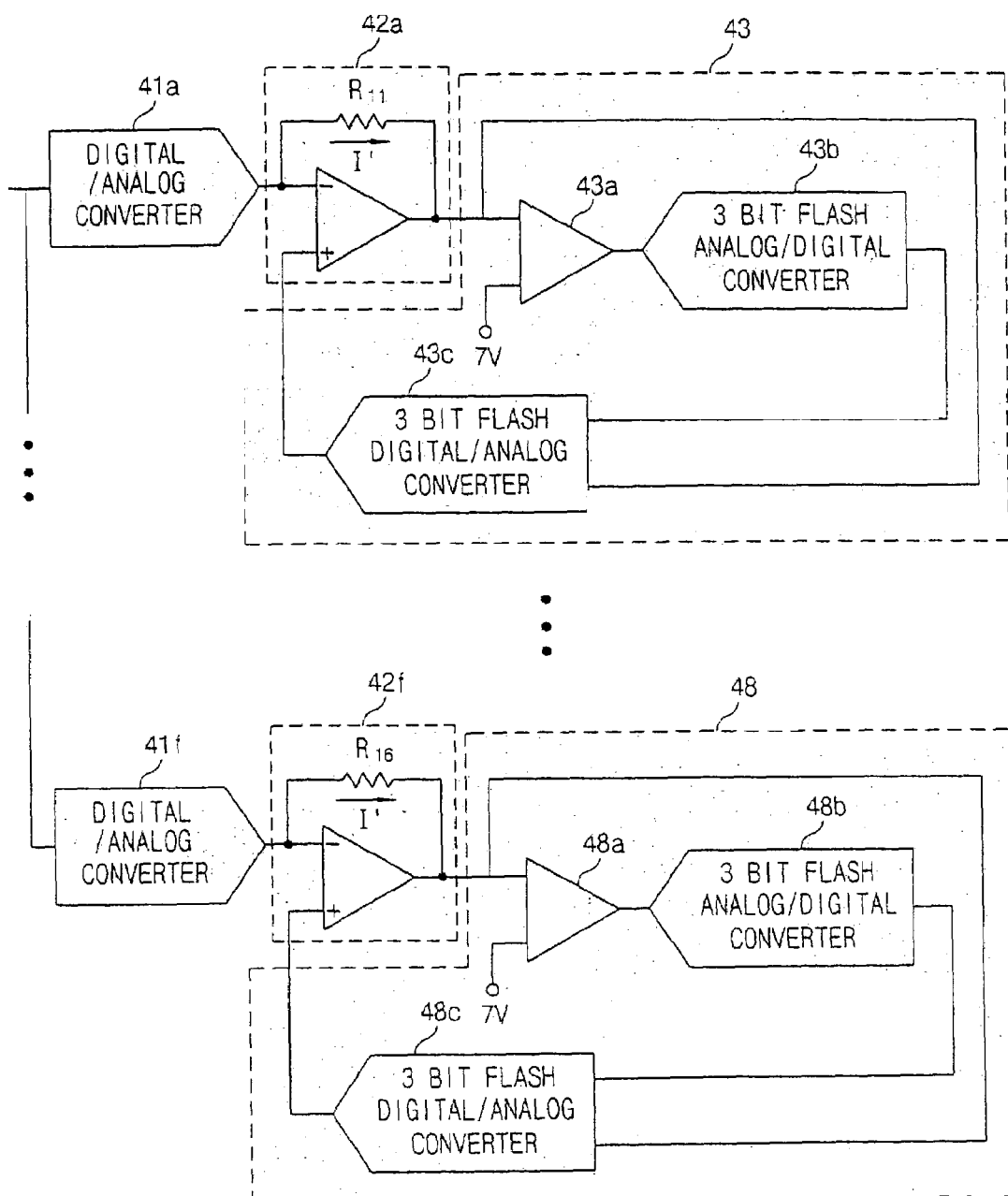
FIG. 4 is a circuit diagram of the offset compensating apparatus of a digital/analog converter which performs an offset compensation by adjusting an input voltage (Vcom) of a buffer unit.

FIG. 4 is a circuit diagram of the offset compensating apparatus of a digital/analog converter which performs an offset compensation by adjusting an input voltage (Vcom) of a buffer unit.

As shown in FIG. 4, a driving unit having the offset compensating unit of a digital/analog converter includes: digital/analog converters 41a~41f for converting a digital input signal into an analog signal and outputting the analog signal; buffer units 42a~42f for dropping a certain bit of analog signal as much as a voltage drop according to the analog output signal and outputting it; and offset compensating units 43~48 for comparing the output voltage of the buffer units 42a~42f and a reference voltage and outputting the certain bit of analog signal according to the comparison result.

The offset compensating unit 43 includes: comparators 43a~43f for comparing an output voltage of the buffer units 42a~42f and a reference voltage; 3 bit flash analog/digital converters 43b~48b for sampling an offset upon receiving an output value of the comparators 43a~43f, and converting the offset value to a digital value to output it; and 3 bit digital/analog converters 43c~48c for receiving the digital signal from the 3 bit flash analog/digital converters 43b~48b and outputting a corresponding analog output value to a positive (+) input terminal of the buffer units 42a~42f.

The operation of the present invention will now be described.

Figure 5:
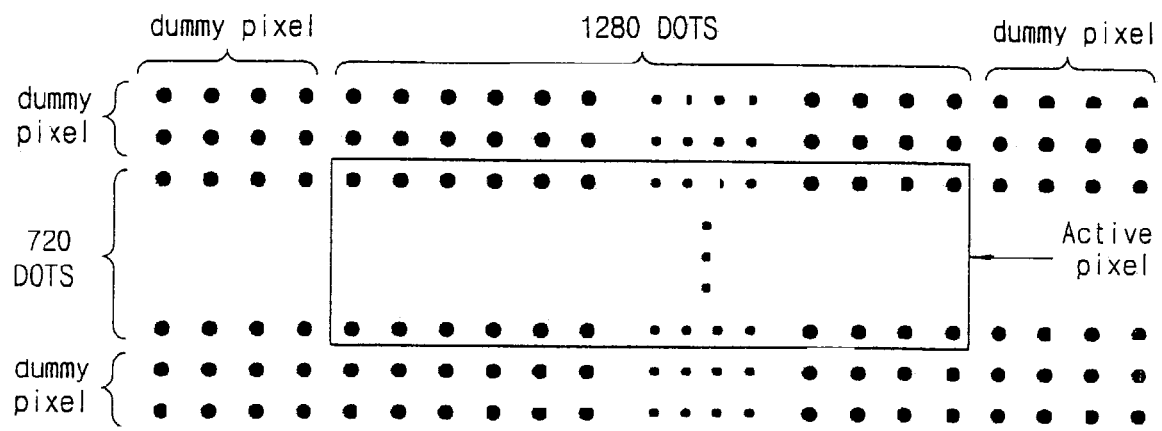
FIG. 5 is a view showing a pixel structure of the driving unit in accordance with the present invention.

FIG. 5 is a view showing a pixel structure of the driving unit in accordance with the present invention.

As shown in FIG. 5, the operation principle of the present invention is that the LCD driving unit is driven with the number of active pixels of 1280*720, so that the offset compensating circuit is used to minimize during the dummy pixel interval which is not displayed on the screen.

That is, when a digital input value is applied during the dummy pixel interval so as for the output value of the buffer units 42a~42f to have 7V, 7V± offset is generated as a final output value (Vout) in the digital/analog converter and the buffer unit.

Accordingly, since the comparing unit of the offset compensating units 43~48 apply a digital input value to have 7V, the offset generated value is sampled and detected through the 3 bit flash analog/digital converters 43b~48b, and the detected value is converted into a digital value which is then outputted to the 3 bit digital/analog converters 43c~48c.

Thereafter, the offset voltage value is compensated to the positive (+) input terminal of the buffer unit through the 3 bit digital/analog converters 43c~48c, thereby removing the offset voltage.

For example, if a voltage (Vcom) inputted to a positive (+) terminal of the buffer unit is 7.1V, higher than 7V, a voltage inputted to a negative (−) terminal of first to sixth buffers (42a~42f) is the same as the input voltage (Vcom) of the positive (+) terminal owing to the ideal characteristics of the OP Amp. That is, the output voltage (Vout) of first to sixth buffers (42a~42f) can be expressed by the following equation (3):

$$V_{out}=7.1-I \times R_{out} \quad (3)$$

Conversely, if the voltage (Vcom) inputted to the positive (+) terminal of the buffer unit is 6.9V, lower than 7V, a voltage inputted to the negative (−) terminal of first to sixth OP Amps (42a~42f) is the same as the input voltage (Vcom) of the positive (+) terminal owing to the ideal characteristics of the OP Amp. That is, the output voltage (Vout) of first to sixth OP Amps (42a~42f) can be expressed by the following equation (4):

$$V_{out}=6.9-I \times R_{out} \quad (4)$$

Accordingly, the output voltage of the buffer unit including first to sixth OP Amps (42a~42f) is compared with 7V, the reference voltage of first to sixth comparators 43a~48a and outputted.

Accordingly, the 3 bit flash analog/digital converter outputs the voltage offset value except for the voltage drop according to the resistance (Rout) and the 3 bit digital/analog converter outputs the offset compensation voltage value to the positive input terminal of the buffer unit according to ON/OFF switching of the switches (SW$_{21}$~SW$_{23}$), thereby compensating the offset.

Figure 6:
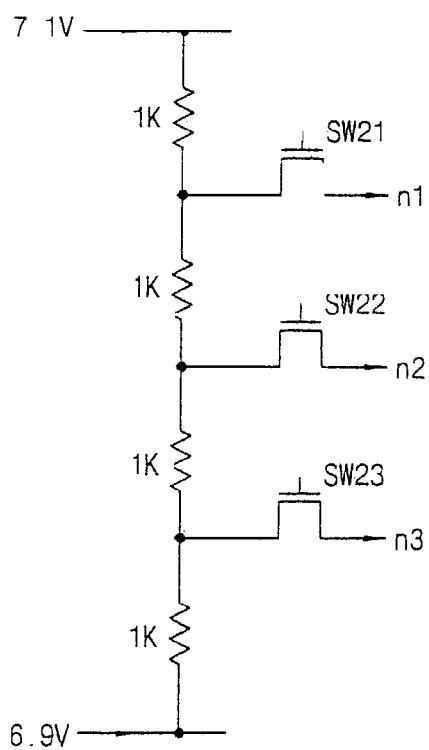
FIG. 6 is a view showing an operation of switching of a 3 bit digital/analog converter.

For example, as shown in FIG. 6, if an input voltage to the 3 bit digital/analog converter (43b~48b) is 7.1V and the first switch SW$_{21}$ is in an ON state, the first analog output voltage (n1) is 7.05V. If the second switch SW$_{22}$ is in an ON state, the second analog output voltage (n2) is 7V. If the third switch SW$_{23}$ is in an ON state, the third analog output voltage n3 is 6.95V. Accordingly, the offset voltage-compensated value is outputted to the positive input terminal of the buffer unit.

Meanwhile, in a different embodiment of the present invention, by changing only the digital coding circuit, an offset is averaged and minimized, which will now be described with reference to FIG. 7.

Figure 7:
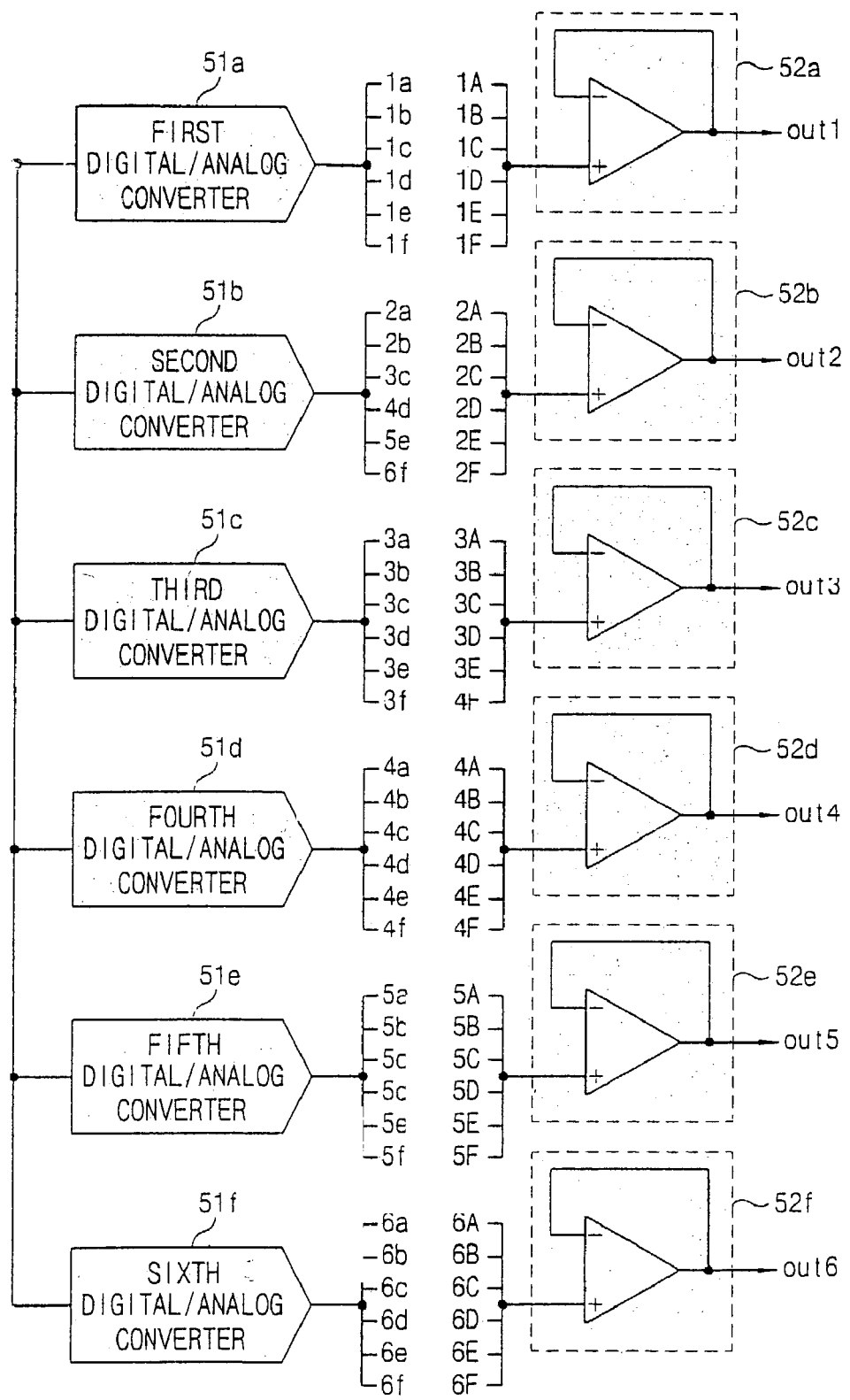
FIG. 7 is a view showing a digital/analog converter for performing an offset compensation by changing a digital coding circuit.

FIG. 7 is a view showing a digital/analog converter for performing an offset compensation by changing a digital coding circuit.

As shown in FIG. 7, in the offset compensating method of the digital/analog converter, when 1280*720 dots are driven by using six channels, the offset compensating is performed by changing the digital coding circuit.

For example, it is assumed that an offset is generated only in the first digital/analog converter 51a and the first digital/analog converter 51a is connected only to the first buffer unit 52a. Then, in detecting a line error of the first digital/analog converter 51a, an offset is constantly generated on the dot of the LCD panel corresponding to the first buffer 52a, so that only the dot the first buffer 52a drives can be darker or brighter.

Therefore, in the offset compensating method of the present invention, the first digital/analog converter 51a is randomly connected to second to sixth buffers 52b~52f, not to the first buffer 52a, so that the offset can be ignored. That is, the offset generated in the first digital/analog converter 51a is averaged to ⅙, thereby compensating the offset.

Figure 8:
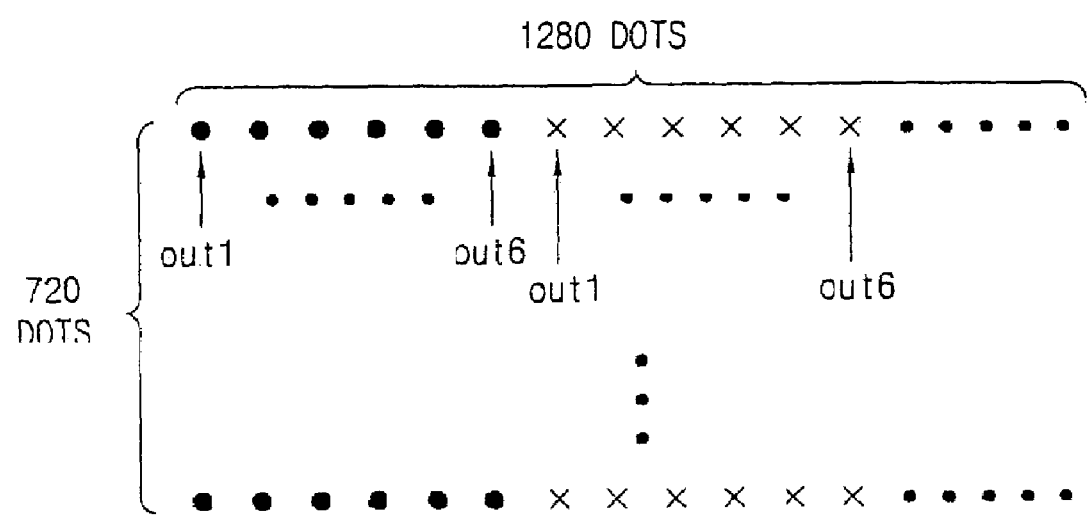
FIG. 8 is a view showing a method for processing 1280*720 dots of an LCD panel through the offset compensating apparatus of a digital/analog converter in accordance with the present invention.

FIG. 8 is a view showing a method for processing 1280*720 dots of an LCD panel through the offset compensating apparatus of a digital/analog converter in accordance with the present invention.

As shown in FIG. 8, in order to output each LCD panel, in a method for processing first data line, a data (out1) is obtained by connecting 1a of the first digital/analog converter 21a to 1A of the first buffer 52a. A data (out2) is obtained by connecting 2a of the second digital/analog converter 51b and 2A of the second buffer 52b. A data (out1) is obtained by connecting 3a of the third digital/analog converter 51c and 3A of the first buffer 52c. A data (out2) is obtained by connecting 4a of the fourth digital/analog converter 51d and 4A of the second buffer 52b. A data (out1) is obtained by connecting 5a of the fifth digital/analog converter 51e and 5A of the first buffer 52a. A data (out2) is obtained by connecting 6a of the sixth digital/analog converter 51f and 6A of the second buffer 52b.

And after the first data line is outputted, the second data line is processed as follows.

A data (out2) is obtained by connecting 1a of the first digital/analog converter 51a and 2A of the second buffer 52b. A data (out3) is obtained by connecting 2a of the second digital/analog converter 51b and 3A of the third buffer 52c. A data (out4) is obtained by connecting 3a of the third digital/analog converter 51c and 4A of the fourth buffer 52d. A data (out5) is obtained by connecting 4a of the fourth digital/analog converter 51d and 5A of the fifth buffer 52b. A data (out6) is obtained by connecting 5a of the fifth digital analog converter 51e and 6A of the sixth buffer 52a. A data (out1) is obtained by connecting 6a of the sixth digital/analog converter 51f and 1A of the first buffer 52b.

Also for the remaining data, the data line values are obtained by changing the digital coding circuit in the same manner.

Consequently, as noted from the fist and second data processing, the offset generated from the first digital/analog converter 21a is averaged to ⅙ by randomly connecting the first to sixth digital analog converters 51a~51f and the first to sixth buffers 52a~52f.

As so far described, the offset compensating apparatus and method of a digital/analog converter of the present invention has the following advantages.

That is, the offset generated in driving a panel or even the offset generated in the buffer is removed or compensated regardless of the type of circuits of the digital/analog converter by switching by adding a current cell of the least significant bit, adjusting and outputting the Vcom voltage of the buffer stage, or by providing the offset compensating unit which changes the digital coding circuit. Accordingly, a picture quality of the projection LCD TV can be improved, and thus, a unit price of a chip for compensating an offset of the driving unit can be reduced and the number of processes can be minimized.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An offset compensating apparatus of a digital/analog converter wherein an offset generated from a driving unit in driving a panel of a projection TV is sampled and detected through an analog/digital converter and an offset compensation value corresponding to the detected offset is outputted to the driving unit.

2. The apparatus of claim 1 further comprising:
a current source for supplying a certain current; and
a buffer unit for comparing an input voltage added or subtracted by the current source and a reference voltage, and outputting a corresponding voltage level.

3. The apparatus of claim 2 comprising:
a first expectation value voltage controller for switched corresponding to an output value of the driving unit to provide a path of the current source to thereby control an expectation value voltage.

4. The apparatus of claim 3, wherein the first expectation value voltage controller comprises:
switches ($SW_{11}$~$SW_{1n}$) switched by a digital signal; and
an N-channel metal-oxide semiconductor current source (or NMOS current source) connected in series to the switches and outputting a certain current value.

5. The apparatus of claim 1 comprising:
a 3 bit flash analog/digital converter for receiving an output of the driving unit, sampling an offset, and digitalizing the offset value and outputting it; and
a second expectation value voltage controller for receiving the output value of the 3 bit flash analog/digital converter, switching it, and controlling a current amount with an expectation value voltage.

6. The apparatus of claim 5, wherein the second expectation value voltage controller comprises:
a switch switched by a digital signal; and
an NMOS current source connected in series to the switch and having a certain current value, the NMOS current sources are connected in parallel.

7. The apparatus of claim 1 comprising:
a least significant bit current cell for controlling a current amount with the expectation value voltage after switching corresponding to the offset detected from the analog/digital converter.

8. The apparatus of claim 1, wherein the output voltage of the driving unit and a reference voltage are compared and a certain bit of analog signal is outputted according to the comparison result.

9. The apparatus of claim 8 comprising:
a comparator for comparing an output voltage of the driving unit including an OP Amp and a reference voltage;
a 3 bit flash analog/digital converter for receiving the output value of the comparator, sampling an offset, and converting the offset value into a digital value and outputting the digital value; and
a 3 bit digital/analog converter for receiving the digital signal from the 3 bit flash analog/digital converter and outputting a corresponding analog output value to a positive (+) input terminal of the OP Amp.

10. The apparatus of claim 9, wherein the 3 bit flash analog/digital converter outputs a voltage offset value except for a voltage drop according to a resistance.

11. The apparatus of claim 9, wherein the 3 bit digital/analog converter outputs an offset compensation voltage value to the positive (+) input terminal of the OP Amp according to ON/OFF switching of the switch.

12. The apparatus of claim 1, wherein the driving unit comprises:
a digital/analog converter:
an OP Amp connected to the digital/analog converter; and
a digital coding circuit for connecting a digital coding signal randomly between the digital/analog converter and the OP Amp.

13. An offset compensating apparatus of a digital/analog converter comprising:
a current source for supplying a certain current;
a comparator for comparing an input voltage added or subtracted as much as a voltage drop according to a current source and a reference voltage, and outputting a corresponding voltage level;
a first expectation value voltage controller switched according to an output of the comparator and providing a path of the current source to control an expectation value voltage; and
an offset removing unit for supplying a current through the first expectation value voltage controller to control the expectation value voltage and compensating an offset.

14. The apparatus of claim 13, wherein the offset removing unit comprises:
a flash analog/digital converter for converting an analog signal of an expectation value voltage level and outputting a certain bit of digital signal; and
a second expectation value voltage controller switched by a certain bit of output signal of the flash analog/digital converter to output a certain current source, and controlling an expectation value voltage.

15. The apparatus of claim 14, wherein the second expectation value voltage controller comprises:

a switch switched by a digital signal; and a current source connected in series to the switch and having a certain current value, the current sources being connected in parallel.

16. The apparatus of claim 13, wherein the first expectation value voltage controller comprises:

a switch switched by a digital signal; and a current source connected in series to the switch and having a certain current value, the current sources being connected in parallel.

17. An offset compensating apparatus of a digital/analog converter comprising:

a digital/analog converter for converting a digital input signal into an analog signal and outputting the analog signal;

a buffer for dropping a certain bit of analog signal as much as a voltage drop according to the analog output signal; and an offset compensating unit for comparing an output voltage of the buffer and a reference voltage, and outputting the certain bit of analog signal according to the comparison result.

18. The apparatus of claim 17, wherein the offset compensating unit comprises:

a comparator for comparing the output voltage of the buffer and a reference voltage, and outputting a voltage as much as the difference;

a 3 bit analog/digital converter for converting it into a 3 bit switching digital signal corresponding to the output signal of the comparator and outputting it; and a 3 bit digital/analog converter switched by the output signal of the 3 bit analog/digital converter and outputting an analog signal.

19. The apparatus of claim 18, wherein, in the 3 bit digital/analog converter, the certain number of resistances are connected in series and a switch is connected between the resistances in order to output an analog voltage according to ON/OFF operation of the switch.

20. An offset compensating method of a digital/analog converter comprising the steps of:

sampling an offset generated from a driving unit of a panel of a projection TV;

digitalizing the sampled offset value; and calculating the digitalized offset value and compensating an offset value of a buffer unit of the driving unit.

21. The method of claim 20, wherein, in the step of compensating an offset value, a switch of the least significant bit is controlled to be ON/OFF upon receiving the digitalized offset value, and an offset compensation value is outputted to an input value of the buffer stage by controlling a current amount with an expectation value voltage.

22. The method of claim 21, wherein the current amount is controlled so that the switch switched by a digital signal and an NMOS current source connected in series to the switch and having a certain current value, the NMOS current sources being connected in parallel to output an expectation value voltage.

23. The method of claim 22, wherein compared with the expectation value, in case of $2^3$, the switch is turned on or off to thereby perform an offset compensation.

24. The method of claim 20, wherein, in the step of sampling an offset, the output voltage of the driving unit and the reference voltage are compared by the comparator in order to sample an offset.

25. The method of claim 20, wherein, in the step of compensating an offset value, the digital signal is received during a dummy pixel interval which is not displayed on a screen, and its corresponding analog output value is outputted to a positive (+) input terminal of the buffer unit.

26. An offset compensating method of a digital/analog converter comprising the steps of:

sequentially connecting an output of a digital/analog converter to an output terminal of the certain number of buffers, and detecting a line error of a digital/analog converter on a dot of an LCD panel; and connecting an output of the corresponding line-error detected digital/analog converter to an input terminal of an adjacent buffer, and averaging an offset.

27. The method of claim 26, wherein, in the step of averaging an offset, an input terminal of the first buffer connected to the offset-detected digital/analog converter is switched to be OFF and connected to an input terminal of the second buffer, thereby averaging a dot driven by the first buffer.

* * * * *